(12) United States Patent
Winkler

(10) Patent No.: US 7,511,242 B2
(45) Date of Patent: Mar. 31, 2009

(54) SENSOR ELEMENT FOR A TOUCH SWITCH, METHOD FOR THE MANUFACTURE OF A SENSOR ELEMENT AND TOUCH SWITCH

(75) Inventor: Uwe Winkler, Ettlingen (DE)

(73) Assignee: E.G.O. Elektro-Geraetebau GmbH, Oberderdingen (DE)

( * ) Notice: Subject to any disclaimer, the term of this patent is extended or adjusted under 35 U.S.C. 154(b) by 0 days.

(21) Appl. No.: 12/029,821

(22) Filed: Feb. 12, 2008

(65) Prior Publication Data

US 2008/0190751 A1    Aug. 14, 2008

(30) Foreign Application Priority Data

Feb. 12, 2007   (DE)   ................. 10 2007 008 178

(51) Int. Cl.
*H03K 17/975* (2006.01)
(52) U.S. Cl. ..................... 200/600; 200/511
(58) Field of Classification Search ........... 200/600, 200/511, 512, 5 A, 61.41–61.44, 85 R, 85 A, 200/85 B, 86 R; 341/22, 33; 345/156, 168, 345/169, 173

See application file for complete search history.

(56) References Cited

U.S. PATENT DOCUMENTS 5,917,165 A    6/1999    Platt et al.

| 6,664,489 B2 | 12/2003 | Kleinhans et al. |
| 6,723,933 B2 * | 4/2004 | Haag et al. ............ 200/61.42 |
| 7,232,973 B2 * | 6/2007 | Kaps et al. ............ 200/600 |
| 2005/0248544 A1 | 11/2005 | Adam et al. |

FOREIGN PATENT DOCUMENTS

| DE | 10 2005 025 021 A1 | 12/2006 |
| EP | 1 732 224 A1 | 12/2006 |

OTHER PUBLICATIONS

German Office Action from German Application No. 10 2007 008 178.4-42, Jan. 22, 2008.

* cited by examiner

*Primary Examiner*—Michael A Friedhofer
(74) *Attorney, Agent, or Firm*—Alston & Bird, LLP

(57) ABSTRACT

A sensor element for a touch switch device has a sensor element body of elastic, electrically conductive material. The sensor element body has two parallel end wall areas as the top and bottom surfaces, which are integrally connected in one piece by inwardly cambered side wall areas. Such a sensor element body can be very easily compressed. The wall thickness of the wall areas is substantially the same throughout. Such sensor elements can be constructed by forming a linear strip of such material having a cross section as described, where the strip is cut into individual pieces, thereby forming each individual sensor element.

20 Claims, 2 Drawing Sheets

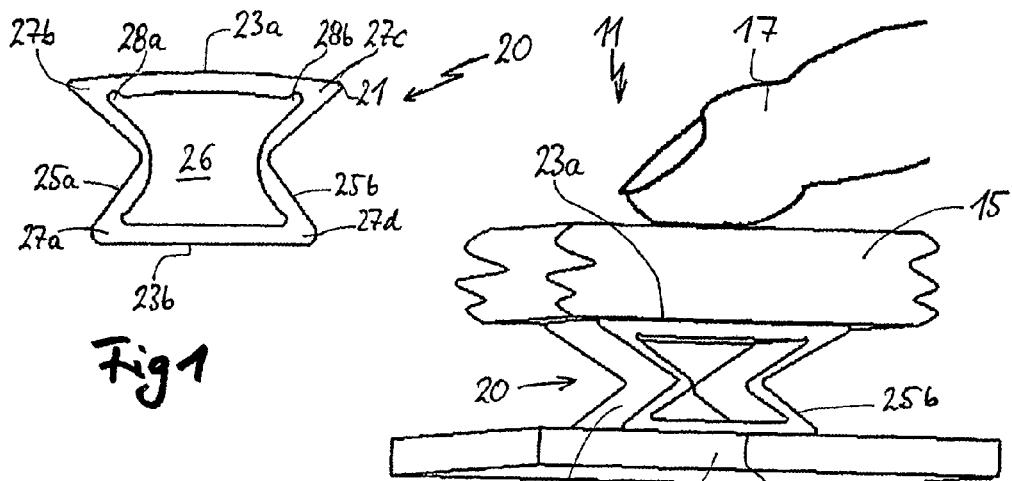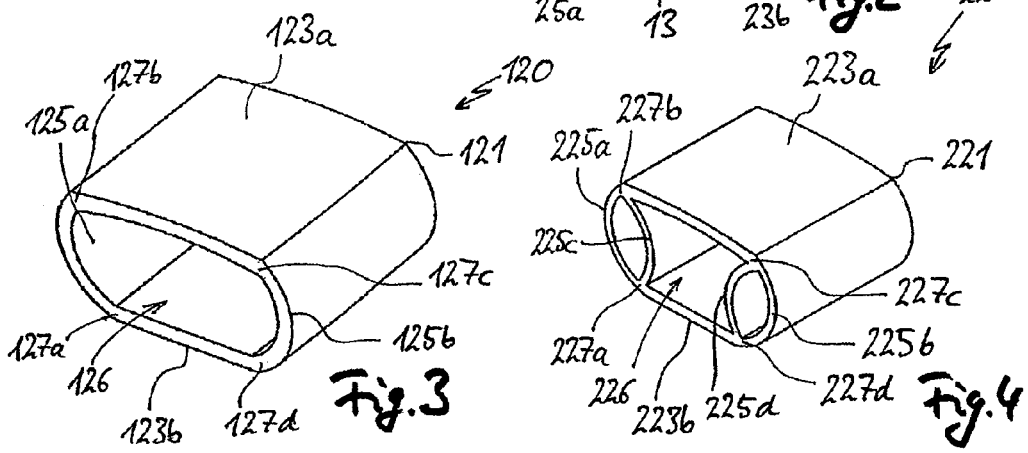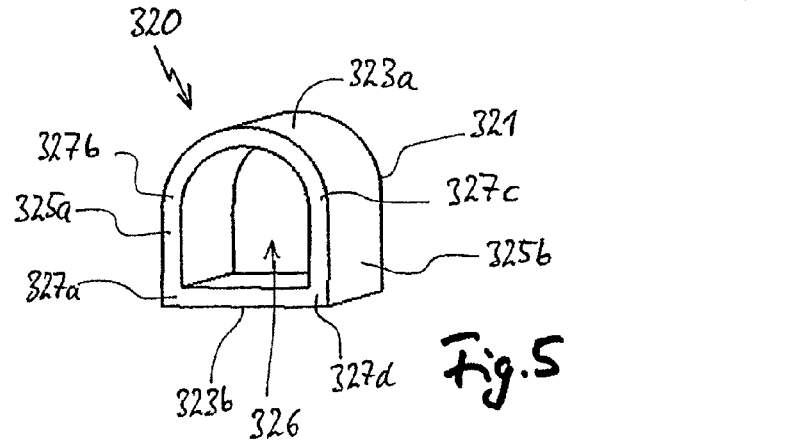

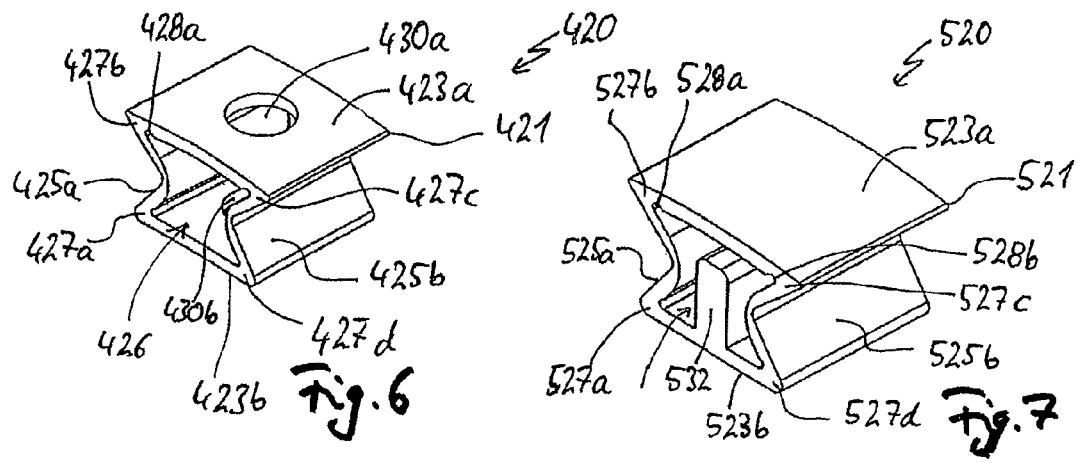
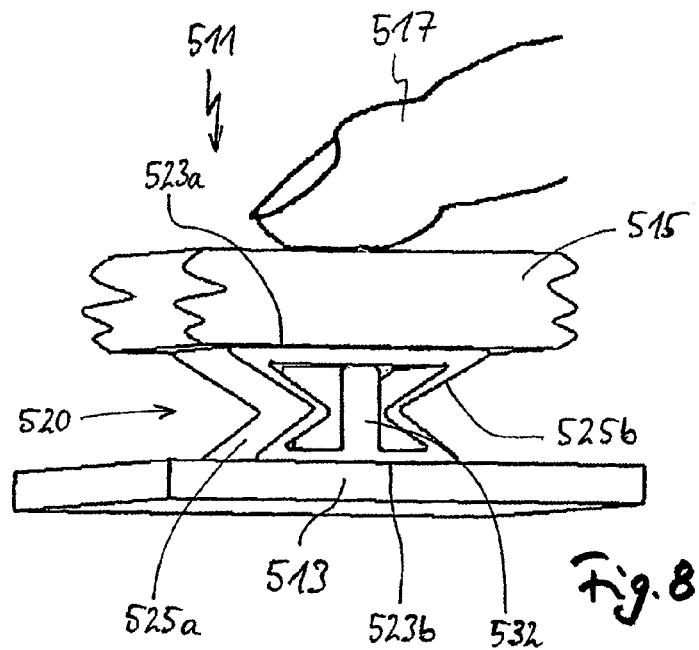

SENSOR ELEMENT FOR A TOUCH SWITCH, METHOD FOR THE MANUFACTURE OF A SENSOR ELEMENT AND TOUCH SWITCH

CROSS REFERENCE TO RELATED APPLICATIONS

This application claims priority to German Application Number 10 2007 008 178.4 filed on Feb. 12, 2007, the contents of which are incorporated by reference.

FIELD OF THE INVENTION

The invention relates to a sensor element for a touch switch, particularly a capacitive touch switch, a method for manufacturing such a sensor element, and a touch switch device having such sensor elements.

BACKGROUND OF THE INVENTION

Sensor elements for capacitive touch switches are fundamentally known from, such as disclosed in U.S. Pat. No. 5,917,165 A.

In the case of an elongated, circular cylindrical sensor element for a capacitive touch switch, it is known from US 2005/248544 A1 to provide a transversely directed bore. This has the advantage of increasing the elasticity of the sensor element or making the sensor element "softer," enabling easier compression.

The problem solved by the invention is to provide an aforementioned sensor element, a method for its manufacture and a touch switch device equipped therewith, which make it possible to solve the problems of the prior art and through which a sensor element can be obtained, that can be particularly easily manufactured, fitted and used.

BRIEF DESCRIPTION OF THE DRAWINGS

Embodiments of the invention are described in greater detail relative to the attached drawings, wherein:

FIG. 1 illustrates a side view of one embodiment of an inventive sensor element with inwardly bent side walls;

FIG. 2 illustrates one embodiment of an inventive touch switch device with a sensor element corresponding to FIG. 1 between a circuit board and an operating surface with applied finger;

FIGS. 3 to 7 illustrate further embodiments of the sensor elements; and

FIG. 8 illustrates a touch switch device similar to FIG. 2 with a sensor element corresponding to FIG. 7.

DETAILED DESCRIPTION OF THE EMBODIMENTS

This problem is solved by a sensor element having the features of claim herein as well as a touch switch equipped with such sensor elements having the features as claimed herein, and a method for the manufacture of such a sensor element having the features as claimed herein. Advantageous and preferred developments of the invention form the subject matter of the further claims and are explained in greater detail hereinafter. By express reference the wording of the claims is made into part of the description.

The sensor element has a sensor element body of elastic material. When it is installed in the touch switch or touch switch device, the sensor element body has an upper top surface and a lower bottom surface facing the same, which are advantageously substantially parallel to one another, or can be slightly inclined to one another. One of these surfaces can also be convexly or concavely curved, this advantageously being the top surface. According to one embodiment of the invention, the sensor element has a box-like construction with continuous wall areas, which run around a larger space ("interspace"). Each of the top and bottom surfaces is formed by a front or end wall area, said two walls being interconnected via intermediate wall areas or side walls. Advantageously, the space or interspace takes up a large part of the cross-section of the entire sensor element body, for example 70% to 90%.

Thus, a sensor element with a sensor element body is created which, as a result of the particularly large interspace, is very elastic or flexible and can be very easily compressed using limited force. On compression the side wall areas, in particular, give way. This can take place in different ways, as will be explained hereinafter.

In another embodiment of the invention, the wall thicknesses of the wall areas are substantially the same, or do not change over a large part of their surface. Preferably, this also applies to the side walls, so that the latter also have a substantially constant and identical wall thickness. It is possible to make the wall thicknesses of the side walls relatively small, so that the sensor elements can be easily compressed. Advantageously, facing wall areas are constructed identically or homologously. Thus, during compression, constant elastic properties independent of the installation orientation can be obtained.

In another embodiment of the invention, the wall thicknesses of the top surface and bottom surface are similar to the wall thicknesses of the side walls. As the shape of these two surfaces should not change or should remain roughly planar, even in the case of a slight compression, the side walls are either elastically compressed, or inwardly or outwardly bent away. Advantageously, the material can be thinned so as to form a hinge or joint. Also, said material thinnings are provided on the top and bottom surfaces, and preferably to such an extent outwards that there is no change to the thickness of the side walls.

In another embodiment of the invention, the wall thickness of a side wall can be approximately 5% to 10% of the width or height of the sensor element. Approximately 0.5 to 2 millimetres (mm) suitable as the wall thickness.

In another embodiment of the invention, the top surface and bottom surface are planar and parallel to one another, substantially also in the non-installed or non-compressed state. The side walls are cambered or constructed in camber-like manner. They are cambered outwards from a centre of the sensor element or from the interspace. On compression, the side walls camber to an even greater extent in this direction. Such a camber can be between 5% and 20% of the sensor element width and in certain circumstances even more. Alternatively, to an outward camber, the side walls can be inwardly cambered to a similar degree. In order to avoid a mutual lateral displacement of top and bottom surfaces on compression, it is advantageous to construct the side wall areas homologously, i.e., both inwardly or both outwardly cambered. A camber can be, on the one hand, substantially uniform or a rounding, or on the other hand, a type of bent down or offset path can give rise to essentially the same effect as a round cambering and in certain cases the sensor element can be even more easily compressed through such a bent configuration.

In the embodiment of cambered side walls, one side wall and a top or bottom surface can be at an angle of 35° to 80°, preferably 40° to 70° to one another. A side wall then projects in inclined manner from the top or bottom surface for further improving compressibility. Advantageously, all the connections between the top surface, bottom surface and side walls are identically constructed or have the same mutual angle.

According to a further embodiment of the invention, there is not only in each case one inwardly or outwardly cambered side wall, but instead they are so-to-speak constructed in double-wall manner and, for example, have two partial side walls, which can be cambered away from one another, i.e., forming a bulge between them and are interconnected at their ends. As a result of this, it is possible to avoid during the compression of the sensor element body and the subsequent stronger curvature or cambering of the side wall area that a torque is transmitted via the connecting area to the top or bottom surface, especially the top surface. This can be further improved in that the connection of the ends of the partial side wall areas is essentially located where they are connected to the top or bottom surface. This leads to a good, very full-surface engagement on a covering or operating surface.

In an alternative embodiment of the invention, the top or bottom surface have a bent or cambered construction, particularly outwardly cambered, particularly with respect to the top surface. This permits an adaptation to a correspondingly cambered covering or operating surface. However, ignoring this aspect, such a sensor element body can have the same construction as described hereinbefore and hereinafter.

Advantageously, the side wall areas of a sensor element body are constructed identically and in particular with a similar length. However, they can also have a different length, so that on installation in a touch switch device, a support for the sensor element body, such as for example a circuit board, need not run parallel to the operating surface above it, or can slope with respect to the same.

Such a sensor element can essentially be made in accordance with the prior art, i.e., from an open-pore or closed-pore elastomer or a polymer. Silicone or silicone polymers are suitable. The sensor element should be electrically conductive and reference is made in this connection to the prior art, particularly the aforementioned U.S. Pat. No. 5,917,165 A or US 2005/248544 A1.

It is possible that in the installed state, the top surface forming the touch contact surface for the touch switch or which is part of the latter, is larger than the bottom surface forming an electrical contacting or connection. However, this can also be reversed.

In another embodiment of the invention, at least one axially aligned opening is provided in the top and bottom surfaces, i.e., a type of through-bore or passage, as is known for sensor element bodies from U.S. Pat. No. 5,917,165 A. Such an opening can be used for transillumination. It can run through a centre point of the sensor element and can represent roughly 10% to 80% of the surface area of the top or bottom surface.

According to another embodiment of the invention, a projection extends into or projects from the interspace from the top or bottom surface. Such a projection is directed towards the facing surface, but has a spacing therefrom and its height can amount to roughly 40% to 80% of the spacing between the surfaces in the uncompressed state. This projection can be used for defining maximum compressibility. Such a sensor element body can therefore be relatively easily compressed until the projection also engages on the facing surface. Although from this point further compression is possible, this involves much greater force expenditure, because then the projection must also be elastically compressed.

In the case of a touch switch device provided with several aforementioned sensor elements or sensor element bodies, the sensor elements are juxtaposed or placed spaced from one another on a support. Such a support can be a circuit board, where there is in particular also a control and/or evaluation for the touch switch device. Electrical contacting can take place to the sensor elements via the support, as is known from the prior art. The bottom surface of the sensor element bodies rests on the support and the top surface engages on an operating surface running at a certain distance above the same, resulting in the top surface adapting in very full surface manner to the operating surface. The interspace of the sensor element body extends axially between the support and the operating surface. Advantageously, all the sensor elements of a touch switch device at least have the same basic construction.

The sensor elements can be stuck to the support, and a two-sided adhesive tape is particularly suitable. The latter can firstly be fixed to the support and then a sensor element is placed thereon. Alternatively and preferably, the adhesive tape is firstly applied to the sensor element. It is possible for individual or cut off sensor elements to be placed on an elongated, two-sided adhesive tape with cover strips. They can then be detached therefrom, so that the adhesive tape remains on the sensor element and forms an adhesive coating, whilst the remaining sensor elements remain on the cover strip. The separation of the sensor elements can also take place on the adhesive tape, but the connecting cover strip should not be separated in order to bring about an easier, cohesive handling.

For the manufacture of an above-described sensor element, it is possible to provide a method for manufacturing a hollow profile from a strip of sensor element material with a cross-section corresponding to a side view of the sensor element. From said strip, each individual sensor element is then cut or cut to length, and they are preferably in each case of the same size or width. Such a cutting to length of the sensor elements can take place at the manufacturing point of the hollow profile or following onto the same. It is alternatively possible to bring a hollow profile of the strip up to a loading machine for a support of the sensor elements and then the cutting to length only takes place at said machine, so that it is easier to bring the sensor elements with a given, desired orientation up to the support.

The sensor element is generally cut to length at right angles and straight from the hollow profile. However, this can also take place with a curved cut. From a longitudinally oriented profile it is possible to obtain a rounded or substantially round sensor element, similar to an upright cylinder.

These and further features can be gathered from the claims, description and drawings and the individual features, both singly or in the form of subcombinations, can be implemented in an embodiment of the invention and in other fields and can represent advantageous, independently protectable constructions for which protection is claimed here. The subdivision of the application into individual sections and the subheadings in no way restrict the general validity of the statements made thereunder.

Turning now to the figures, FIG. 1 shows in side view an inventive sensor element 20 with a sensor element body 21. This makes it clear that sensor element 20 or sensor element body 21 is integrally manufactured with an upper top surface 23a and a facing bottom surface 23b. The two surfaces 23a and b are linked by the left-hand side wall 25a and the right-hand side wall 25b, said side walls surrounding an interspace or space 26. Top surface 23a and bottom surface 23b are connected to side walls 25a and 25b by connections 27a-27d. Side walls 25a and 25b have an inward bend or kink roughly in the centre.

It can be seen how a thinning of the material 28a in the form of a notch is provided at connection 27b at the transition from the left-hand side wall 25a to top surface 23a. This also applies to the connection 27c between top surface 23a and the right-hand side wall 25b with material thinning 28b. Such material thinnings 28a and 28b are provided here on top surface 23a and ensure an easier bending or kinking of the side walls 25a and 25b in the inwards direction on compressing sensor element 20 in the installation state.

FIG. 1 shows a cross-section of sensor element 20. In the case of an aforementioned hollow profile from which sensor elements 20 are cut, said cross-section can have a constant shape. Sensor element 20 or sensor element body 21 can be made from an above-described, elastic material, for example a fine-pore foam or rubber. Manufacture can take place to a random length by extrusion.

FIG. 2 shows an inventive touch switch device 11 with a sensor element 20, which is placed on a circuit board 13 as the support and rests thereon by bottom surface 23b. An operating surface 15 engages on top surface 23a. The distance between circuit board 13 and operating surface 15 is slightly smaller than the height of sensor element 20 in the relieved or relaxed state according to FIG. 1, so that the sensor element 20 is compressed in FIG. 2. The height reduction of sensor element 20 can be approximately 15%.

According to the prior art circuit board 13 can form an electrical connection to sensor element 20 through top-applied, optionally metallized contact zones. It can also carry a control or evaluation for the sensor element and optionally the entire touch switch device 11 or an electrical appliance.

The operating surface 15 can be a glass plate or glass ceramic plate and can form part of a hob or some other surface of an electrical appliance. The surface of sensor element 20 on the underside of operating surface 15 or top surface 23a forms a capacitive sensor element or a capacitor plate, as is known from the prior art. The interspace of the sensor element is oriented axially between the plates. A finger 17 placed on the top of operating surface 15 can be detected by the touch switch device 11 for triggering a switching function or the like.

As can be gathered from FIG. 2, through the compression of the sensor element 20 the top surface 23a shown in slightly cambered form in FIG. 1 is as planar as the underside of operating surface 15. The inwardly bent side walls 25a and 25b are bent in more strongly in the manner of a spring. It is clear that the force expenditure for the compression of such a sensor element 20 accompanied by elasticity is much smaller than with a sensor element body made from solid material or in accordance with US 2005/248544 A1. This leads to a correspondingly large, electrically conductive surface, namely top surface 23a, engaging on the underside of operating surface 15 and is connected to a control or evaluation via the electrically conductive side walls 25a and 25b and bottom surface 23b.

It is pointed out that in the case of the touch switch device 11, circuit board 13 and operating surface 15 are so firmly interconnected that their mutual spacing is always the same. Tolerances compensate the spring characteristics of the sensor element. In the embodiment shown said spacing is not dependent on the application of a finger 17, but this is also possible.

FIG. 3 shows as a variant a sensor element 120 with a sensor element body 121 which, as in FIG. 1, has an upper top surface 123a and a lower bottom surface 123b. Top surface 123a and bottom surface 123b, unlike in FIG. 1, are interconnected via outwardly cambered side walls 125a and 125b and they are relatively uniformly rounded or cambered, so that a low, barrel-shaped body is obtained. If such a sensor element 120 is compressed, for example, as installed in a touch switch device according to FIG. 2, the side wall areas 125a and 125b bend somewhat more towards the outside.

FIG. 4 shows in a further variant a sensor element 220 with a sensor element body 221, which are similarly constructed to those of FIG. 3. In addition to the outwardly cambered side walls 225a and 225b, inwardly cambered side walls 225c and 225d are provided and all are in the form of partial side walls. The connection of all the side walls 225a-225d to top surface 223a and bottom surface 223b in each case takes place in connection areas 227a-227d and therefore in each case roughly at a single point. Thus, so-to-speak side walls areas 225a-227d form double walls with in each case two partial side wall areas. On compressing sensor element 220, the outwardly cambered partial side walls 225a and 225b are outwardly cambered to an even greater extent and the inwardly cambered partial side walls 225c and 225d are more strongly inwardly cambered. As a result there is essentially no twisting at connections 227 or the transitions to top surface 223a and bottom surface 223b. For roughly constant wall thicknesses the spring action of partial side wall areas 225 can be intensified and as a result the sensor element 220 is not quite as easily compressed.

FIG. 5 shows as a further variant a sensor element 320, in which left and right-hand side walls 325a and 325b project almost at right angles upwardly from the lower bottom surface 323b. At a certain height the side walls 325a and 325b pass without transition and thinning or thickening of the wall thickness into top surface 323a, which is cambered upwards in the manner of a pitch circle. Such a sensor element 320 also falls within the scope of the invention. It is particularly suitable if an operating surface above the same against which the sensor element 320 is to be pressed, is not flat as shown in FIG. 2, but is instead cambered like the camber of the upper top surface 323a and advantageously somewhat less. Here again, in the manner described hereinbefore, a capacitive sensor element is formed by the top surface 323a engaging directly on the underside of the operating surface. It is also readily conceivable as a variant of FIG. 5 to camber the top surface 323a spherically upwards or in certain circumstances with a corresponding shape downwards.

In a further variant, FIG. 6 shows a sensor element 420 essentially corresponding to that of FIGS. 1 and 2, but with the modification that in both instances, there is an axially aligned opening 430a and 430b in the top surface 423a and bottom surface 423b. A LED or light guide can project through the lower opening 430b projecting from a circuit board similar to FIG. 2 and emitting its light upwards through the upper opening 430a. In principle, this corresponds to a longitudinal bore according to U.S. Pat. No. 5,917,165 A. It is naturally also possible to have several such openings in the top or bottom surface.

FIG. 7 as a further variant shows a sensor element 520, which is based on that of FIGS. 1 and 2. The top surface 523a and bottom surface 523b, as well as the side walls 525a and 525b are constructed and interconnected according to FIGS. 1 and 2. The difference is that a projection 532 projects upwards and centrally from bottom surface 523b and runs towards the top surface 523a, but maintains a certain distance therefrom. In particular, the height of projection 523 is roughly 75% of the total height of interspace 526. It is clear that projection 532 is relatively stable and its thickness is two to five times the thickness of the walls.

The sensor element 520 of FIG. 7 is shown in FIG. 8 in the installed state as a variant of FIG. 2. The touch switch device 511 shows that here operating surface 515 is so close to circuit board 513 that in the case of the sensor element 520 between them projection 532 is pressed onto the inner underside of top surface 523*a*. The projection forms a type of stop for the compression of sensor element 520. Although further compression is possible, there is a significant rise in the force required, because now the compression of projection 532 is added thereto.

In another embodiment of the invention, it is also possible for a side wall between the top and bottom surfaces to have several kinks or cambers, especially in the manner of a concertina or the like, or similar to a bellows. Such a sensor element can also be made and cut from a longitudinal strand having a constant cross-section.

The invention claimed is:

1. A sensor element for a capacitive touch switch, said sensor element having a sensor element body comprising an electrically conductive elastic material, said sensor element body having a top surface with a top thickness and a bottom surface with a bottom thickness, said top surface and said bottom surface being substantially parallel to each other and facing each other, wherein said sensor element has a box-like construction with walls constructed continuously around a larger interspace, said top surface and said bottom surface being in each case formed by a side wall and said top surface and said bottom surface being interconnected via said side wall extending between them.

2. The sensor element according to claim 1, wherein a wall thicknesses of said side walls are the same.

3. The sensor element according to claim 1, wherein a wall thicknesses of said side walls are thinner than either said top thickness or said bottom thickness.

4. The sensor element according to claim 3, wherein said side walls are constructed in homologously identical manner.

5. The sensor element according to claim 1, wherein material thinnings are provided at transitions between said top surface and said bottom surface and said side walls.

6. The sensor element according to claim 1, wherein a wall thicknesses of said side walls are between 5% to 10% of the width or height of said sensor element.

7. The sensor element according to claim 1, wherein said top surface and said bottom surface are substantially flat and parallel to one another.

8. The sensor element according to claim 7, wherein at least one said side wall is cambered outwards away from a centre of said sensor element, said camber being between 5% and 20% of a width of said sensor element.

9. The sensor element according to claim 7, wherein at least one said side wall is inwardly cambered to a centre of said sensor element, said camber being between 5% and 20% of a width of said sensor element.

10. The sensor element according to claim 7, wherein at least one said side wall is at an angle between 35° to 80° to said top surface or said bottom surface.

11. The sensor element according to claim 10, wherein said top and said bottom surfaces and said side walls have a same mutual angle relative to each other.

12. The sensor element according to claim 1, wherein said side wall is constructed in double-wall manner with two partial side walls, which are cambered away from one another and interconnected at their ends, said interconnection of said ends of said partial side walls forming a connection with said top or said bottom surface.

13. The sensor element according to claim 1, wherein said material comprises an elastomer or polymer.

14. The sensor element according to claim 13, wherein, said bottom surface is smaller than said top surface, said top surface forming a touch contact surface for a touch switch.

15. The sensor element according to claim 1, wherein there is an axially aligned opening in said top and said bottom surface through a centre of said sensor element.

16. The sensor element according to claim 1, wherein from said bottom surface is formed a projection of a height in said interspace between said sideways, said height being 30% to 80% of a distance between said bottom surface and said top surface in an uncompressed state.

17. A touch switch device comprising:
a plurality of sensor elements juxtaposed to each other, wherein each sensor element comprises:
a sensor element body comprising an electrically conductive elastic material, said sensor element body having a top surface and a bottom surface being substantially parallel to each other and positioned over each other, wherein said sensor element has a box-like construction with wall areas being constructed continuously around an interspace, said top surface and said bottom surface being in each case interconnected via said side walls extending between said top surface and said bottom surface;
an operating surface forming a surface of a hob, said operation surface contacting said top side of each of said plurality of sensor elements; and
a circuit board positioned parallel to said operating surface, said circuit board contacting said bottom side of each of said plurality of sensor elements.

18. The touch switch device according to claim 17, wherein said plurality of sensor elements are adhered to said circuit board using a two-sided adhesive tape.

19. A method for the manufacture of a sensor element comprising an electrically conductive elastic sensor element material, said sensor element comprising a sensor element body having a top surface with a top thickness and a bottom surface with a bottom thickness being substantially parallel to each other and facing each other, wherein said sensor element has a box-like construction with walls constructed continuously around a larger interspace, said top surface and said bottom surface being in each case formed by a side wall and said top and said bottom surfaces being interconnected via said side wall extending between them, comprising the steps of:
forming a strip made from said sensor element material comprising a cross-section of said sensor element; and
cutting a fixed length from said strip to form said individual sensor element.

20. The method according to claim 19, wherein one said sensor element is cut off with a curved cut in such a way that said sensor element is approximately round on a side.

* * * * *